(12) United States Patent
Yuan et al.

(10) Patent No.: US 12,284,877 B2
(45) Date of Patent: Apr. 22, 2025

(54) DISPLAY DEVICE, DISPLAY PANEL HAVING STORAGE CAPACITOR, AND METHOD OF MANUFACTURING DISPLAY PANEL

(71) Applicants: Hefei BOE Joint Technology Co., Ltd., Anhui (CN); BOE Technology Group Co., Ltd., Beijing (CN)

(72) Inventors: Zhidong Yuan, Beijing (CN); Can Yuan, Beijing (CN); Xuelian Cheng, Beijing (CN); Jing Gan, Beijing (CN); Meng Li, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 499 days.

(21) Appl. No.: 17/427,074

(22) PCT Filed: Dec. 29, 2020

(86) PCT No.: PCT/CN2020/140959
§ 371 (c)(1),
(2) Date: Jul. 29, 2021

(87) PCT Pub. No.: WO2021/136285
PCT Pub. Date: Jul. 8, 2021

(65) Prior Publication Data
US 2022/0102461 A1    Mar. 31, 2022

(30) Foreign Application Priority Data

Jan. 2, 2020 (CN) .......................... 202010001672.X

(51) Int. Cl.
*H10K 59/121* (2023.01)
*H10K 50/86* (2023.01)
(Continued)

(52) U.S. Cl.
CPC ....... *H10K 59/1216* (2023.02); *H10K 50/865* (2023.02); *H10K 59/1213* (2023.02);
(Continued)

(58) Field of Classification Search
CPC .......... H10K 59/1216; H10K 59/1213; H10K 59/126; H10K 59/122; H10K 59/38;
(Continued)

(56) References Cited

U.S. PATENT DOCUMENTS

2011/0109596 A1* 5/2011 Yoon ................. H10K 59/126
345/204
2014/0183538 A1* 7/2014 Kim ................... H01L 27/1255
257/71
(Continued)

FOREIGN PATENT DOCUMENTS

CN  108511462 A   9/2018
CN  109166896 A   1/2019
(Continued)

OTHER PUBLICATIONS

CN202010001672.X first office action.
PCT/CN2020/140959 international search report.
CN202010001672X Second office action.

*Primary Examiner* — Khiem D Nguyen
(74) *Attorney, Agent, or Firm* — IPro, PLLC

(57) ABSTRACT

A display device, a display panel thereof, and a method of manufacturing the display panel are provided. The display panel includes: a substrate; a light-emitting structure disposed on the substrate; a pixel driving circuit disposed between the substrate and the light-emitting structure, and including a storage capacitor, an orthographic projection of the storage capacitor on the substrate at least partially overlaps with an orthographic projection of the light-emitting structure on the substrate, the storage capacitor includes a first transparent electrode plate disposed adjacent to the (Continued)

substrate and a second transparent electrode plate disposed far away from the substrate, and an orthographic projection of the first transparent electrode plate on the substrate is located within an orthographic projection of the second transparent electrode plate on the substrate.

15 Claims, 15 Drawing Sheets

(51) Int. Cl.
  *H10K 59/38* (2023.01)
  *H10K 71/00* (2023.01)
  *H10K 59/12* (2023.01)
(52) U.S. Cl.
  CPC ............. *H10K 59/38* (2023.02); *H10K 71/00* (2023.02); *H10K 59/1201* (2023.02)
(58) Field of Classification Search
  CPC ............. H10K 59/123; H10K 59/8792; H10K 50/865; H10K 59/1201
  See application file for complete search history.

(56) References Cited

U.S. PATENT DOCUMENTS

| | | | |
|---|---|---|---|
| 2015/0097172 A1* | 4/2015 | Han | H01L 27/1288 257/43 |
| 2015/0179724 A1* | 6/2015 | Lee | H01L 21/28008 438/23 |
| 2016/0118452 A1* | 4/2016 | Pyon | H01L 27/124 257/40 |
| 2018/0159090 A1* | 6/2018 | Cha | H01L 27/1255 |
| 2019/0074306 A1* | 3/2019 | Liu | H01L 27/124 |
| 2019/0280049 A1* | 9/2019 | Wang | H10K 59/00 |
| 2019/0355763 A1* | 11/2019 | Chen | H10K 71/00 |
| 2019/0393290 A1* | 12/2019 | Beak | H10K 71/00 |
| 2020/0098841 A1* | 3/2020 | Song | H10K 59/1216 |
| 2020/0105789 A1* | 4/2020 | Fang | H01L 27/124 |
| 2020/0219770 A1 | 7/2020 | Lee et al. | |
| 2021/0183977 A1* | 6/2021 | Xiao | H10K 59/1216 |
| 2021/0327984 A1 | 10/2021 | Han | |

FOREIGN PATENT DOCUMENTS

| | | |
|---|---|---|
| CN | 110047892 A | 7/2019 |
| CN | 110098235 A | 8/2019 |
| CN | 111180491 A | 5/2020 |

* cited by examiner

DISPLAY DEVICE, DISPLAY PANEL HAVING STORAGE CAPACITOR, AND METHOD OF MANUFACTURING DISPLAY PANEL

CROSS REFERENCE TO RELATED APPLICATIONS

This application is a US national phase of a PCT application under PCT/CN2020/140959, which is filed on Dec. 29, 2020 and claims the priority of the Chinese patent application No. 202010001672.X entitled with "DISPLAY DEVICE, DISPLAY PANEL AND METHOD OF MANUFACTURING DISPLAY PANEL" and filed on Jan. 2, 2020, the content of which is incorporated herein by reference in entirety.

TECHNICAL FIELD

Embodiments of the present disclosure relate to the technical field of display devices, and in particular to a display device, a display panel, and a method of manufacturing the display panel.

BACKGROUND

Active-matrix organic light-emitting diode (AMOLED) display devices have broad market applications. Bottom-emitting OLED display devices are mainly used for large-size display devices, such as OLED TVs.

An opening area and a storage capacitor are designed to separate from each other in an OLED display substrate. The portion of the storage capacitor is composed of a source-drain metal layer, an ITO layer, and a semiconductor layer. Light is made not to pass through the storage capacitor, which affects an aperture ratio of the OLED display substrate.

SUMMARY

Embodiments of the present disclosure provide a display device, a display panel, and a method of manufacturing the display panel.

The first aspect of the embodiments of the present disclosure provides a display panel, including:
 a substrate; a light-emitting structure disposed on the substrate; and a pixel driving circuit disposed between the substrate and the light-emitting structure, the pixel driving circuit comprising a storage capacitor, an orthographic projection of the storage capacitor on the substrate at least partially overlapping with an orthographic projection of the light-emitting structure on the substrate; wherein the storage capacitor includes a first transparent electrode plate and a second transparent electrode plate, the first transparent electrode plate is disposed adjacent to the substrate and the second transparent electrode plate is disposed away from the substrate, and an orthographic projection of the first transparent electrode plate on the substrate is located within an orthographic projection of the second transparent electrode plate on the substrate.

Optionally, the pixel driving circuit further includes a transistor, the transistor includes an active layer and a gate, an interlayer dielectric layer is coated on a side of the active layer and the gate away from the substrate, and the interlayer dielectric layer is provided with an opening at least exposing the first transparent electrode plate.

Optionally, the active layer is disposed adjacent to the substrate, the gate is disposed far away from the substrate, and the active layer and the first transparent electrode plate are disposed on a same layer.

Optionally, a light-shielding layer is disposed between the substrate and the active layer, and the light-shielding layer is electrically connected to a first electrode or a second electrode of the transistor, and the first electrode indicates one of a source and a drain, and the second electrode indicates the other of the source and the drain.

Optionally, a passivation layer is coated on a side of the interlayer dielectric layer and the first transparent electrode plate away from the substrate, a second transparent electrode plate is disposed on a side of the passivation layer away from the substrate, a planarization layer is disposed on a side of the second transparent electrode plate and the passivation layer away from the substrate, a first electrode of the light-emitting structure is disposed on a side of the planarization layer away from the substrate, a first electrical connection structure is disposed in the passivation layer, the second transparent electrode plate is electrically connected to a first electrode or a second electrode of the transistor via the first electrical connection structure, the first electrode indicates one of a source and a drain, and the second electrode indicates the other of the source and the drain; and a second electrical connection structure is disposed in the planarization layer, the first electrode is electrically connected to the second transparent electrode plate via the second electrical connection structure, and a size of an orthographic projection of the first electrical connection structure on the substrate is less than or equal to a size of an orthographic projection of the second electrical connection structure on the substrate.

Optionally, the orthographic projection of the first electrical connection structure on the substrate is located within the orthographic projection of the second electrical connection structure on the substrate Optionally, the pixel driving circuit has a 3T1C structure, and the 3T1C structure includes a switching transistor, a driving transistor, and a sensing transistor.

Optionally, the light-emitting structure includes a first electrode, a second electrode, and a light-emitting layer disposed between the first electrode and the second electrode, and the light-emitting layer is an organic light-emitting layer.

Optionally, a color filter layer is disposed between the light-emitting structure and the pixel driving circuit.

A second aspect of the present disclosure provides a method of manufacturing a display panel, including:
 forming a pixel driving circuit on a substrate, the pixel driving circuit comprising a storage capacitor comprising a first transparent electrode plate disposed adjacent to the substrate and a second transparent electrode plate disposed away from the substrate, an orthographic projection of the first transparent electrode plate on the substrate located within an orthographic projection of the second transparent electrode plate on the substrate, the first transparent electrode plate and the second transparent electrode plate are formed with a same half-tone mask;
 forming a planarization layer on a side of the pixel driving circuit away from the substrate, and forming a light-emitting structure on a side of the planarization layer away from the substrate, wherein an orthographic projection of the light-emitting structure on the substrate at least partially overlaps with an orthographic projection of the storage capacitor on the substrate.

Optionally, the light-emitting structure includes a first electrode, a light-emitting layer, and a second electrode that are sequentially formed; the first electrode, the first transparent electrode plate, and the second transparent electrode plate are formed through a same half-tone mask.

Optionally, the pixel driving circuit further includes a transistor, the transistor includes an active layer and a gate, and an interlayer dielectric layer is formed on a side of the active layer and the gate away from the substrate, an opening at least exposing the first transparent electrode plate is formed in the interlayer dielectric layer; a light-shielding layer and a buffer layer are sequentially formed between the substrate and the active layer, a first through hole is formed in the interlayer dielectric layer and the buffer layer, and the first through hole exposes a portion of the light-shielding layer; and the opening and the first through hole are formed through a same half-tone mask.

Optionally, the transistor includes a first electrode and a second electrode, the first electrode indicates one of a source and a drain, and the second electrode indicates the other of the source and the drain; the first electrode, the second electrode, and the light-shielding layer are formed through a same half-tone mask.

Optionally, a passivation layer is formed on a side of the first electrode and the second electrode of the transistor, the interlayer dielectric layer, and the first transparent electrode plate away from the substrate, and a second through hole is formed in the passivation layer, the second through hole exposes the first electrode or the second electrode; the second transparent electrode plate is formed on a side of the passivation layer away from the substrate, the second transparent electrode plate is electrically connected to the first electrode or the second electrode through a conductive material in the second through hole; a planarization layer is formed on a side of the second transparent electrode plate and the passivation layer away from the substrate, and a third through hole is formed in the planarization layer to expose the second transparent electrode plate, a first electrode of the light-emitting structure is formed on a side of the planarization layer away from the substrate, the first electrode is electrically connected to the second transparent electrode plate via a conductive material in the third through hole, and the third through hole and the second through hole is formed through a same half-tone mask.

A third aspect of the present disclosure provides a display device including any one of the display panels as described above.

According to the above embodiments of the present disclosure, the first transparent plate and the second transparent plate enable that the orthographic projection of the storage capacitor on the substrate at least partially overlaps with the orthographic projection of the light-emitting structure on the substrate, and the orthographic projection of the first transparent plate on the substrate is located within an orthographic projection of the second transparent plate on the substrate. Compared with a solution in which the two-electrode plate of the storage capacitor are not transparent conductive electrode plates, the aperture ratio and the pixel density (PPI) can be improved.

It should be understood that the above general description and the following detailed description are only exemplary and explanatory, and cannot be construed as a limit to the present disclosure.

BRIEF DESCRIPTION OF THE DRAWINGS

The drawings herein are incorporated into the specification and constitute a part of the specification, illustrate embodiments conforming to the disclosure, and are used together with the specification to explain the principle of the disclosure.

Figure 1:
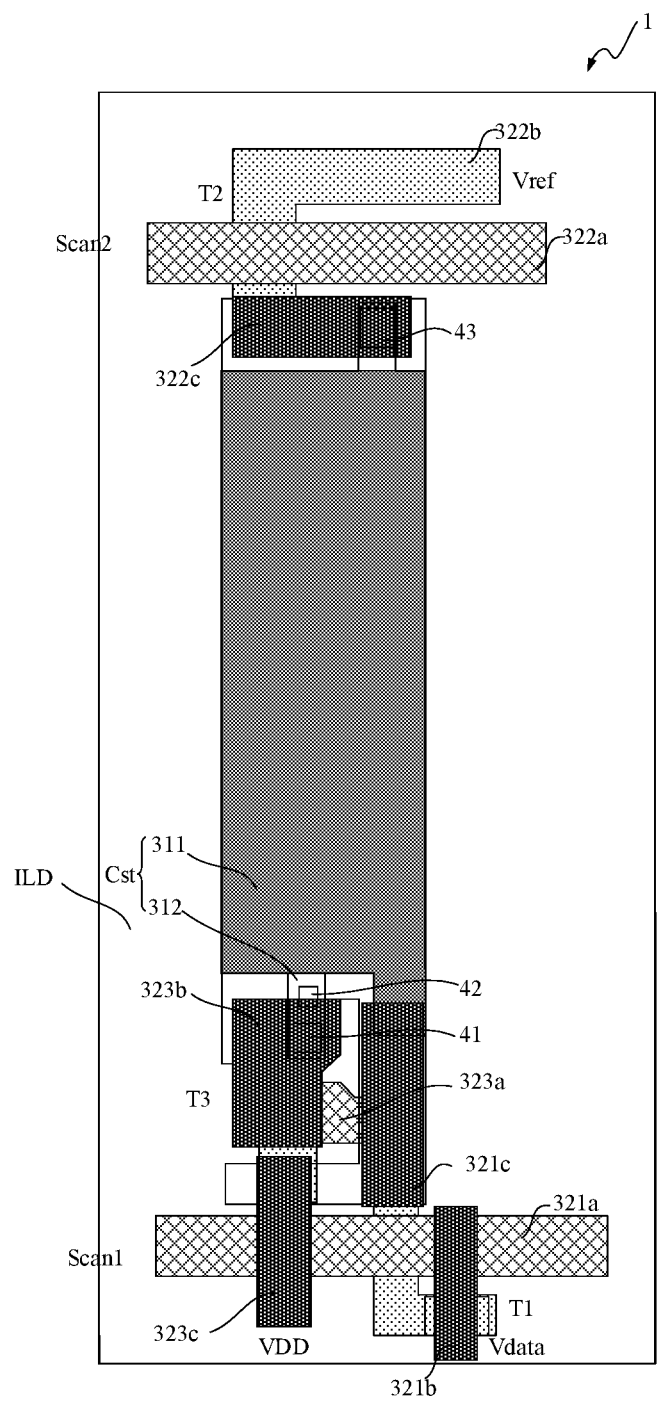
FIG. 1 illustrates a top view of a display panel according to an embodiment of the present disclosure, in which a light-emitting structure and a second transparent plate of a storage capacitor is illustrated in perspective.

| Reference Signs | |
|---|---|
| Display panel 1, 2, 3 | Substrate 10 |
| Light-emitting structure 20 | Pixel driving circuit 30 |
| Storage capacitor Cst | First transparent electrode plate 311 |
| Second transparent electrode plate 312 | Switching transistor T1 |
| Sensing transistor T2 | Driving transistor T3 |
| Scanning signal Scan1, Scan2 | Data writing signal Vdata |
| Power supply voltage VDD | Light-shielding layer SHL |
| Active region 321d of switching transistor | Gate 321a of switching transistor |
| First electrode 321b of switching transistor | Second electrode 321c of switching transistor |
| Active region 322d of sensing transistor | Gate 322a of sensing transistor |
| First electrode 322b of sensing transistor | Second electrode 322c of sensing transistor |

-continued

| Reference Signs | |
|---|---|
| Active region 323d of driving transistor | Gate 323a of driving transistor |
| First electrode 323b of driving transistor | Second electrode 323c of driving transistor |
| Interlayer dielectric layer ILD | Passivation layer PVX |
| Planarization layer PLN | First electrode 20a |
| Pixel Definition Layer PDL | Light-emitting layer 20c |
| Second electrode 20b | First electrical connection structure 41 |
| Second electrical connection structure 42 | Third electrical connection structure 43 |
| Buffer layer 11 | First half-tone mask HTM 1 |
| Second half-tone mask HTM 2 | Third half-tone mask HTM 3 |
| Fourth half-tone mask HTM 4 | |

DETAILED DESCRIPTION OF THE EMBODIMENTS

Exemplary embodiments will be described in detail hereinafter, and examples thereof are illustrated in the accompanying drawings. When the following description refers to the drawings, unless otherwise indicated, the same reference signs in different drawings designate the same or similar elements. The implementation manners described in the following exemplary embodiments do not represent all implementation manners consistent with the present disclosure. On the contrary, they are merely examples of devices and methods consistent with some aspects of the disclosure as defined in the appended claims.

Figure 2:
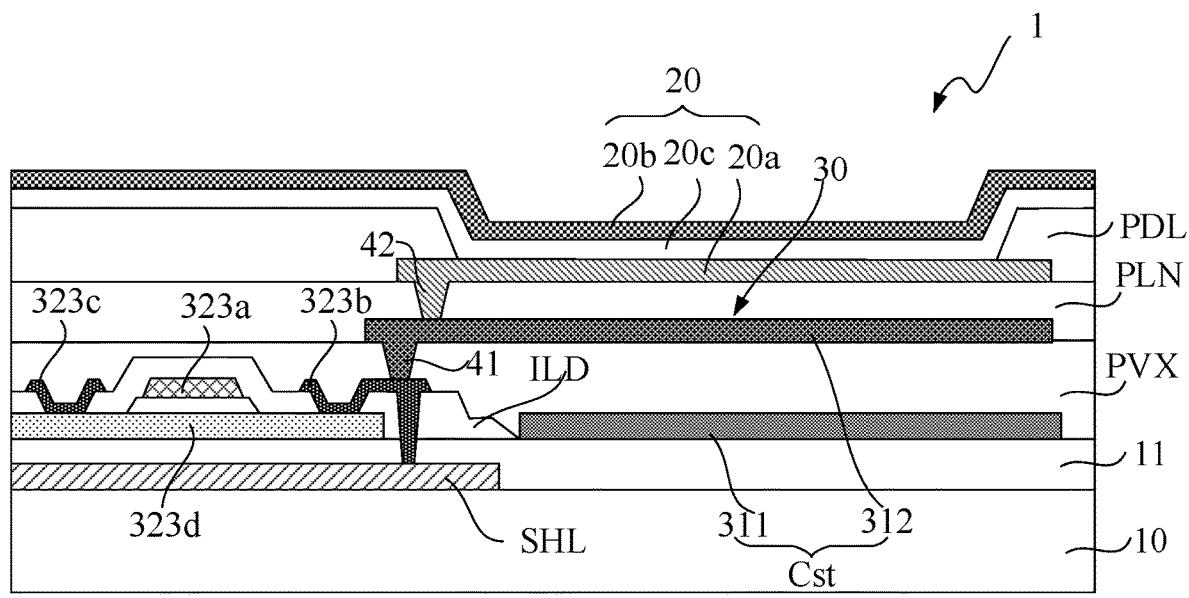
FIG. 2 illustrates a cross-sectional view of a transistor and a storage capacitor in FIG. 1.

FIG. 1 illustrates a top view of a display panel according to an embodiment of the present disclosure, in which a light-emitting structure and a second transparent electrode plate of a storage capacitor are illustrated in perspective. FIG. 2 illustrates a cross-sectional view of a transistor and a storage capacitor of FIG. 1.

Referring to FIG. 1 and FIG. 2, a display panel 1 includes:
a substrate 10 and a light-emitting structure 20 disposed on the substrate 10; a pixel driving circuit 30 disposed between the substrate 10 and the light-emitting structure 20, the pixel driving circuit 30 including a storage capacitor Cst, an orthographic of the storage capacitor on the substrate 10 at least partially overlapping an orthographic projection of the light-emitting structure 20 on the substrate 10, the storage capacitor Cst including a first transparent electrode plate 311 disposed adjacent to the substrate 10 and a second transparent electrode plate 312 disposed far away from the substrate 10; wherein an orthographic projection of the first transparent electrode plate 311 on the substrate 10 is located within an orthographic projection of the second transparent electrode plate 312 on the substrate 10.

Correspondingly, an embodiment of the present disclosure provides a method of manufacturing a display panel 1, including:

Step S1: forming a pixel driving circuit 30 on a substrate 10, the pixel driving circuit 30 including a storage capacitor Cst, the storage capacitor Cst including a first transparent electrode plate 311 disposed adjacent to the substrate 10 and a second transparent electrode plate 312 disposed far away from the substrate 10, an orthographic projection of the first transparent electrode plate 311 on the substrate 10 located within an orthographic projection of the second transparent electrode plate 312 on the substrate, and the first transparent electrode plate 311 and the second transparent electrode plate 312 formed through a same half-tone mask;

Step S2: A planarization layer PLN is formed on a side of the pixel driving circuit 30 away from the substrate 10, and a light-emitting structure 20 is formed on a side of the planarization layer PLN away from the substrate 10. An orthographic projection of the light-emitting structure 20 on the substrate 10 at least partially overlaps an orthographic projection of the storage capacitor Cst on the substrate 10.

Figure 3:
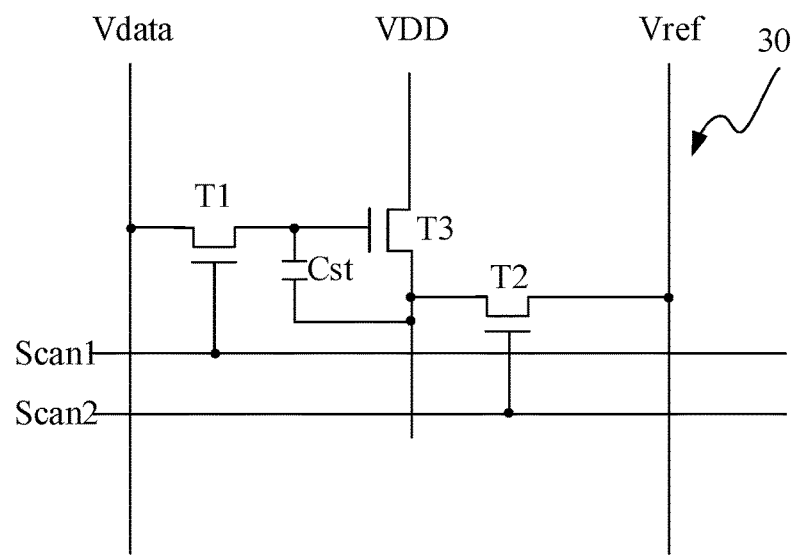
FIG. 3 illustrates a schematic circuit diagram of a pixel driving circuit with a 3T1C structure.

FIG. 3 illustrates a schematic circuit diagram of a pixel driving circuit with a 3T1C structure. Referring to FIG. 3, the 3T1C structure includes a switching transistor T1, a sensing transistor T2, a driving transistor T3, and a storage capacitor Cst.

The operation process of the 3T1C pixel driving circuit is as follows:

Writing stage: in a case that a scanning signal Scan1 is at high level and a scanning signal Scan2 is at low level, the switching transistor T1 is turned ON, the sensing transistor T2 is turned OFF, and a data writing signal Vdata is transmitted to a second electrode of the switching transistor T1, that is, a gate of the driving transistor T3. Thus, under control of the data writing signal Vdata, a power supply voltage VDD (high level) is transmitted to a first electrode of the driving transistor T3, thereby driving the light-emitting structure 20 to emit light; and Sensing compensation stage: in a case that both the scanning signals Scan1 and Scan2 are at high levels, the switching transistor T1 and the sensing transistor T2 are turned ON, in addition to the operation that the data writing signal Vdata is transmitted to the gate of the driving transistor T3 in the normal writing stage so as to write data, under control of the scanning signal Scan2, a sensing compensation signal Vref is transmitted to a second electrode of the sensing transistor T2, that is, the first electrode of the driving transistor T3, and a voltage of a gate of the driving transistor T3 is pulled up to a voltage of the first electrode of the driving transistor T3 through the storage capacitor Cst, thereby further controlling a current driving the light-emitting structure 20. The first electrode indicates one of a source and a drain, and the second electrode indicates the other of the source and the drain.

In order to clearly illustrate distribution of film layers of FIG. 1 and FIG. 2, a display panel and a method of manufacturing the display panel are respectively described hereinafter in conjunction with FIG. 4 to FIG. 13.

Figure 4:
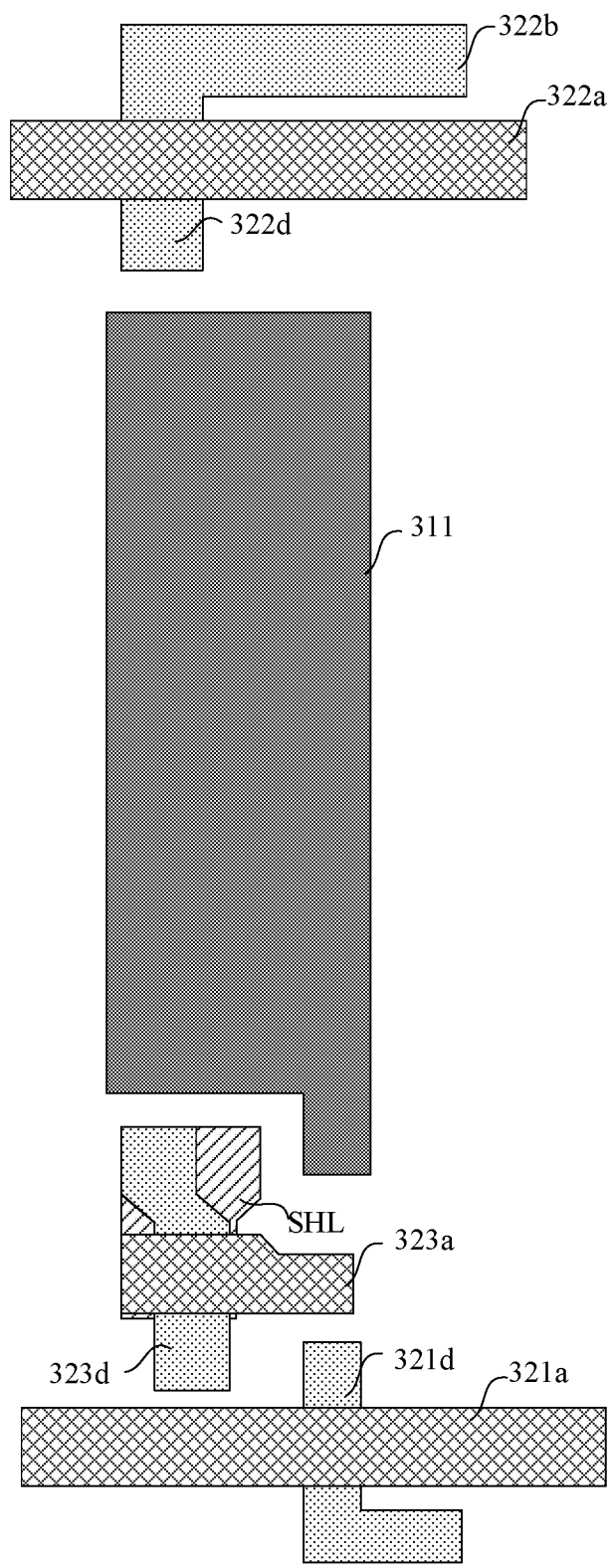
FIG. 4 illustrates a distribution diagram of a light-shielding layer, an active layer, a first transparent electrode plate, and a scanning signal line in FIG. 1.

FIG. 4 illustrates a distribution diagram of a light-shielding layer, an active layer, a first transparent electrode plate, and a scanning signal line as illustrated in FIG. 1.

Referring to FIG. 4 and FIG. 2, a light-shielding layer SHL is disposed on the substrate 10. A position and a size of the light-shielding layer SHL correspond to an active region 323d of the driving transistor T3, and at least correspond to a channel region of the driving transistor T3, so as to prevent external light from entering the channel region from the bottom of the substrate 10, which generates thermally-generated carriers, causes thermal noise and results in drift of a threshold voltage of the driving transistor T3. In some embodiments of the present disclosure, a light-shielding layer SHL may further be provided under an active region of other transistor. A material of the light-shielding layer SHL may be a material with poor light transmittance, such as molybdenum.

Correspondingly, step S1 includes steps S11 to S19.

Figure 5:
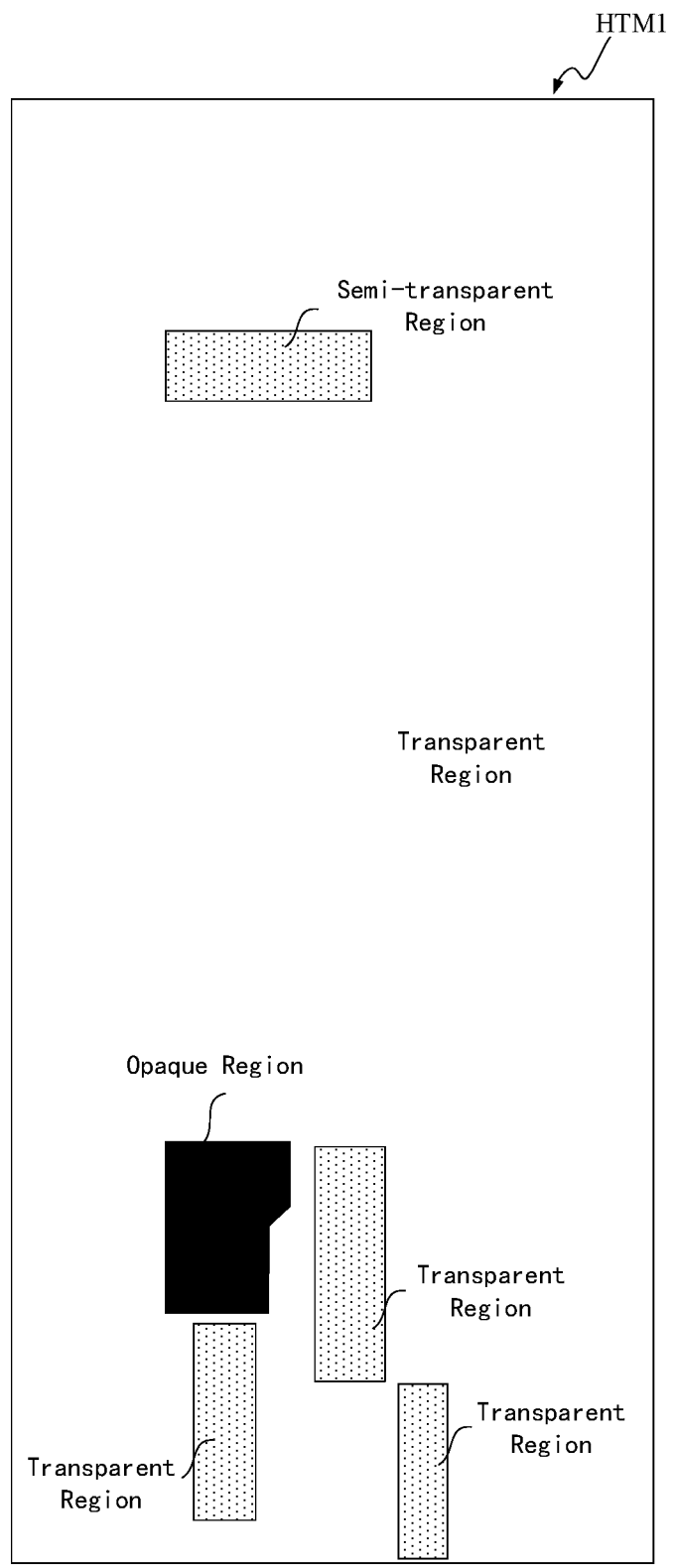
FIG. 5 illustrates a top view of the first half-tone mask.

FIG. 5 illustrates a top view of the first half-tone mask.

Step S11: a light-shielding layer SHL is formed on the substrate 10.

In an embodiment of the present disclosure, a light-shielding material layer is formed on an entire surface of the substrate 10, and then a positive photoresist layer is formed on the light-shielding material layer. The positive photoresist layer is patterned through a first half-tone (HTM) mask 1 as illustrated in FIG. 5. Afterwards, a light-shielding layer SHL is formed by etching the light-shielding material layer with the photoresist pattern as a mask.

As illustrated in FIG. 5, the first half-tone mask HTM1 has an opaque area, a semi-transparent area, and a transparent region. A shape and a position of the light-shielding layer SHL correspond to the opaque region, and other portions of the light-shielding material layer correspond to the semi-transparent region and the transparent region. a) Before etching of the light-shielding layer by controlling exposure conditions (such as energy and duration), photoresist in the semi-transparent region and in the transparent region are exposed and developed and solved in a developing solution, such that photoresist only remains in the opaque region and no photoresist remains in the semi-transparent region and in the transparent region. Or b) through incomplete exposure, the photoresist in the transparent region is fully converted and solved in the developing solution; the photoresist in the semi-transparent area is not fully converted, and a portion of the photoresist in the semi-transparent is not solved in the developing solution; and the photoresist in the opaque area is not converted and is not solved in the developing solution. And next, duration of ashing is controlled, for example, the photoresist in the semi-transparent region and the photoresist in the opaque region are ashed at the same time until the photoresist remaining in the semi-transparent region is all ashed. At this time, photoresist is remained in the opaque area as the photoresist remaining in the opaque area has a relatively great thickness. And afterward, the light-shielding layer SHL is formed by etching the light-shielding material layer with the photoresist pattern as a mask.

In an embodiment of the present disclosure, a light-shielding material layer is first formed on an entire surface of the substrate 10, and then a negative photoresist layer is applied on the light-shielding material layer, and then the negative photoresist layer is patterned through a first half-tone mask HTM1. And next, a light-shielding layer SHL is formed by etching the light-shielding material layer with the photoresist pattern as a mask. The opaque region and transparent region of the first half-tone mask HTM 1 are opposite to the opaque region and the transparent region as illustrated in FIG. 5, that is, the semi-transparent region remains unchanged, and a shape and a position of the light-shielding layer SHL correspond to the transparent region, and other portions of the light-shielding material layer correspond to the opaque region. Operations may be referred to the above description adaptively, will not be elaborated here.

Step S12: a buffer layer 11 is formed on the light-shielding layer SHL and on a surface of the substrate that is not covered by the light-shielding layer SHL.

A buffer layer 11 may be disposed on the light-shielding layer SHL and the surface of the base not coated by the light-shielding layer SHL. A material of the buffer layer 11 may be silicon dioxide, silicon nitride, and the like. On one hand, the buffer layer serves to planarize, and on the other hand, it may further improve adhesion between the substrate 10 and upper film layers (for example, the active layer). In a case that the substrate 10 is made of an organic flexible material, such as polyimide, the buffer layer can further prevent external water vapor from permeating into the upper film layers (for example, the active layer).

The active layer may include: an active area 321d of the switching transistor, an active area 322d of the sensing transistor, and an active area 323d of the driving transistor.

The active layer may be made of a low temperature polysilicon (LTPS) or a low temperature polycrystalline oxide (LTPO). Regions of the active layer other than a channel region may be subject to conductivity treatment so as to improve conductivity of, for example, the first electrode 322b of the sensing transistor T2.

The conductivity treatment may be ion implantation. For example, the low-temperature polysilicon may be implanted with arsenic ions or phosphorus ions, and the low-temperature polycrystalline oxide may be implanted with boron ions.

Step S14: a first transparent electrode plate 311 is formed on a side of the buffer layer 11 away from the substrate 10.

A material of the first transparent electrode plate 311 may be a transparent conductive material, such as metal oxides, for example, indium tin oxide (ITO).

The first transparent electrode plate 311 and the active layer are disposed on a same layer, namely, on the buffer layer 11. Compared with the solution with complex film layers between the first transparent electrode plate 311 and the substrate 10, light transmittance at the opening of the light-emitting structure 20 may be increased in the technical solutions according to the present disclosure.

Figure 6:
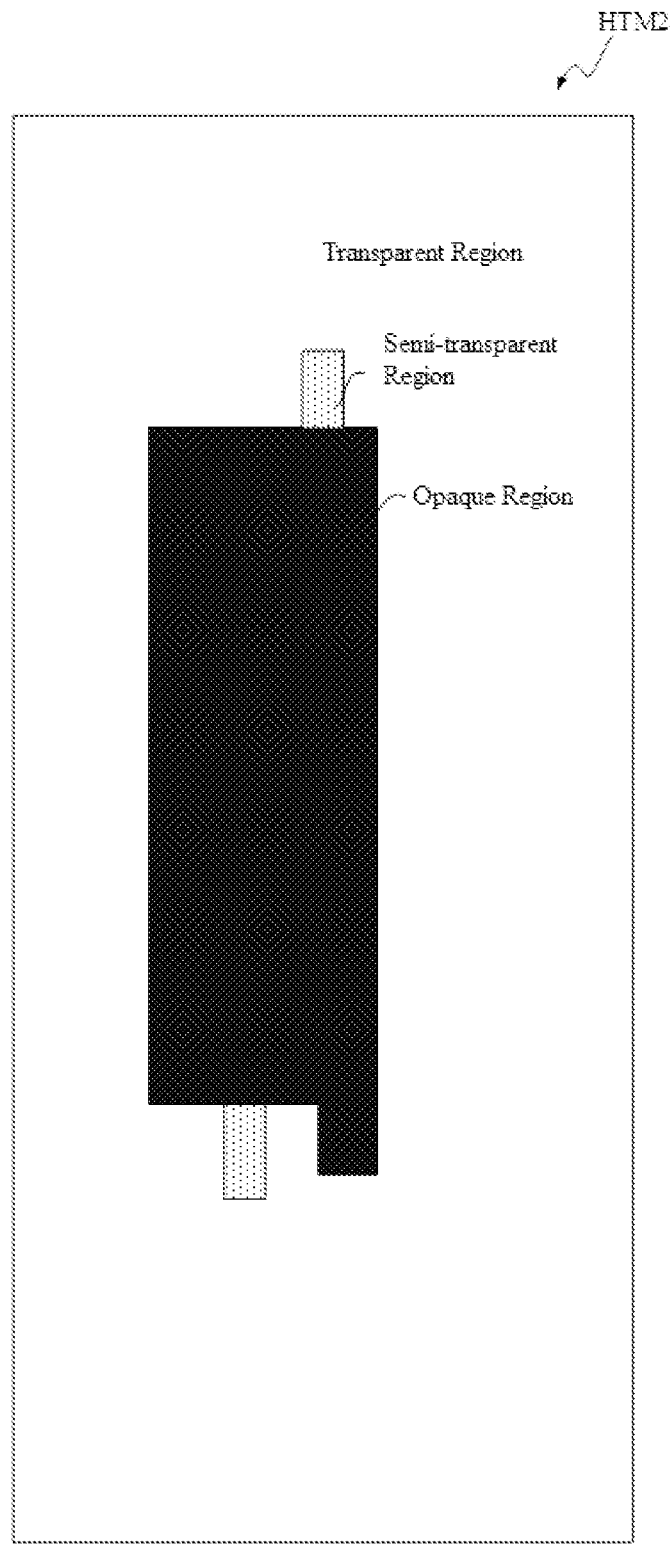
FIG. 6 illustrates a top view of a second half-tone mask.

FIG. 6 illustrates a top view of a second half-tone mask.

The second half-tone mask HTM 2 can be used to form the first transparent electrode plate 311.

Referring to FIG. 6, the second half-tone mask HTM 2 has an opaque region, a semi-transparent region, and a transparent region.

For the exposure of positive photoresist, a shape and a position of the first transparent plate 311 correspond to the opaque region, and other portions correspond to the semi-transparent region and the transparent region. Before forming the first transparent electrode plate 311 by controlling ashing through controlling exposure conditions (energy, time) or duration of ashing, the photoresist only remains in the opaque region.

For exposure of negative photoresist, the opaque region and the transparent region of the second half-tone mask HTM 2 are opposite to the opaque region and the transparent region as illustrated in FIG. 6. That is, the semi-transparent region remains unchanged, the shape and the position of the first transparent electrode plate 311 correspond to the transparent region, and other portions correspond to the opaque region. Before forming the first transparent electrode plate 311 by etching through controlling exposure conditions (energy, time) or duration of ashing, the photoresist only remains in the transparent region.

Step S15: a gate insulating layer and a scanning signal line are sequentially formed on a side of the buffer layer 11 and the active layer away from the substrate 10.

A portion of the scanning signal line can serve as a gate. The gate may include a gate 321a of the switching transistor T1, a gate 322a of the sensing transistor T2, and a gate 323a of the driving transistor T3.

A material of the scanning signal line may be, for example, metal or polysilicon.

A gate insulating layer is disposed between the gate and the active layer.

Figure 7:
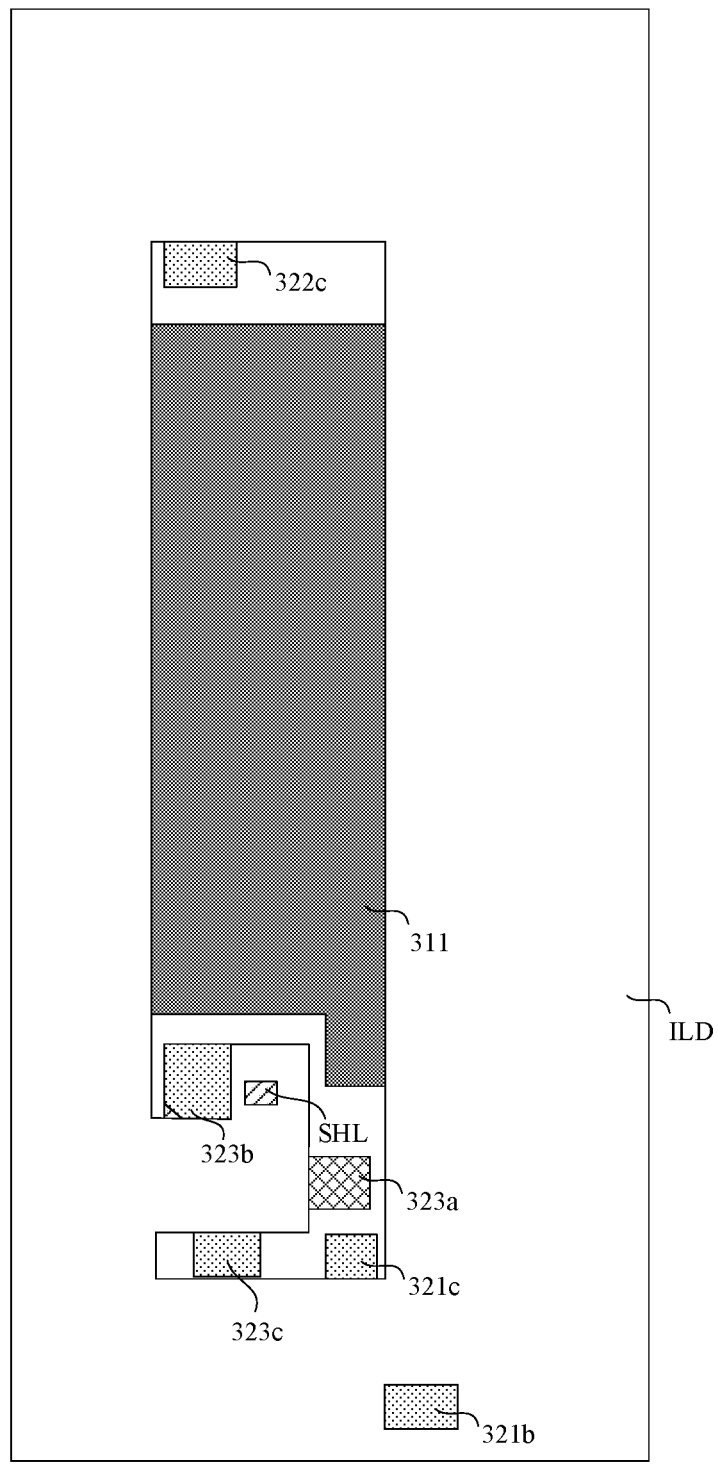
FIG. 7 illustrates an interlayer dielectric layer added to the structure of FIG. 4.

FIG. 7 illustrates an interlayer dielectric layer added to the structure of FIG. 4.

Referring to FIG. 7 and FIG. 2, an opening is provided in the interlayer dielectric layer ILD. A first through hole is provided in the interlayer dielectric layer ILD and the buffer layer 11. The first through hole exposes a portion of the light-shielding layer SHL. The opening exposes the first transparent electrode plate 311, a portion of the second electrode 322c of the sensing transistor T2, a portion of the first electrode 321b and a portion of the second electrode 321c of the switching transistor T1, and a portion of the first electrode 323b, a portion of the second electrode 323c, and a portion of the gate 323a of the driving transistor T3. The first electrode is one of the source and the drain, and the second electrode is the other of the source and the drain. It should be noted that at this step, the second electrode 322c of the sensing transistor T2, the first electrode 321b and the second electrode 321c of the switching transistor T1, and the first electrode 323b and the second electrode 323c of the driving transistor T3 have not been formed yet.

Figure 8:
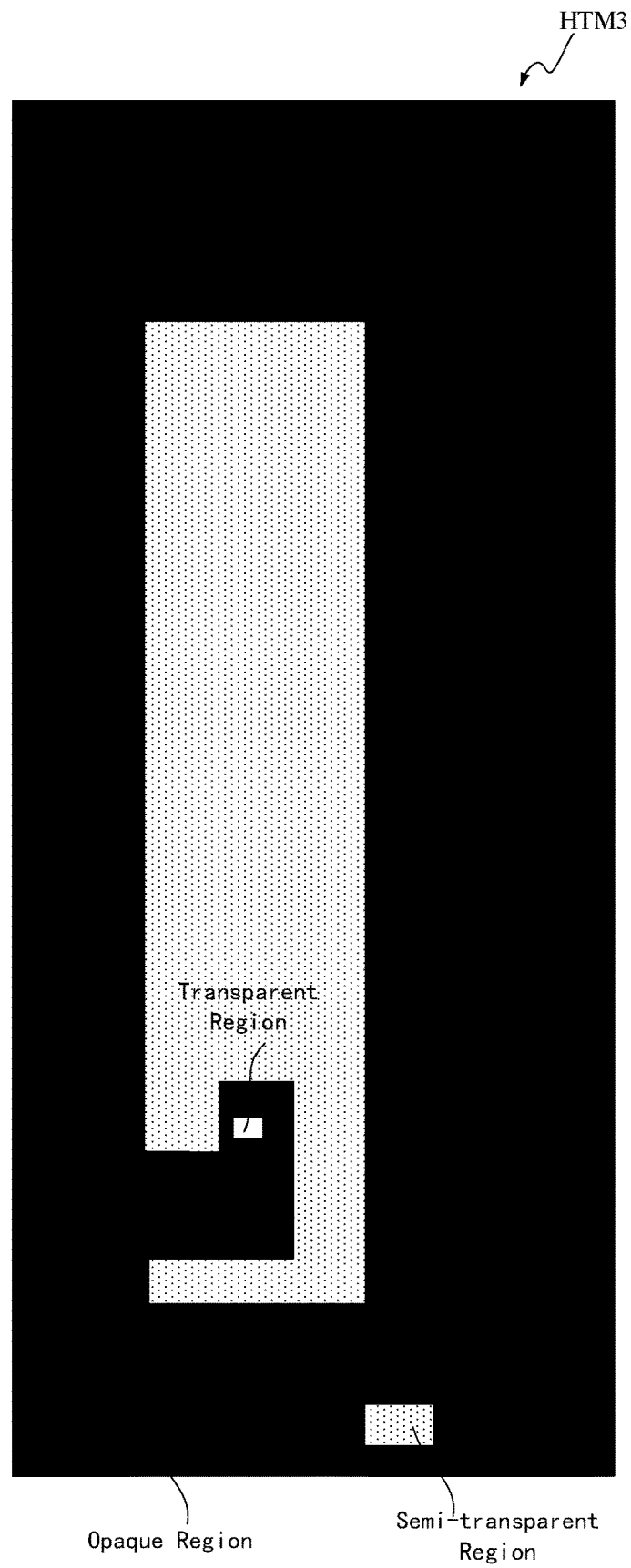
FIG. 8 illustrates a top view of a third half-tone mask.

FIG. 8 illustrates a top view of a third half-tone mask.

The third half-tone mask HTM 3 can be used in a case that the interlayer dielectric layer ILD is exposed.

Referring to FIG. 8, the third half-tone mask HTM 3 has an opaque region, a semi-transparent region, and a transparent region.

For exposure of positive photoresist, a shape and a position of the first through hole configured to expose the light-shielding layer SHL correspond to the transparent region; a shape and a position of the opening configured to expose the first transparent plate 311, the second electrode 322c of the sensing transistor T2, and the first electrode 321b and the second electrode 321c of the switching transistor T1, the first electrode 323b, the second electrode 323c and the gate 323a of the driving transistor T3 correspond to the semi-transparent region; other areas correspond to the opaque region. Before controlling the exposure conditions (energy and duration) to control the etching, the photoresist in the opaque region is relatively thick, the photoresist in the semi-transparent region is relatively thin, and no photoresist remains in the transparent region.

For exposure of negative photoresist, the opaque region and the transparent region of the third half-tone mask HTM 3 are opposite to the opaque region and the transparent region as illustrated in FIG. 8. That is, the semi-transparent region remains unchanged, and a shape and a position of the first through hole that exposes the light-shielding layer SHL corresponds to the opaque region; a shape and a position of the opening that exposes the first transparent plate 311, the second electrode 322c of the sensing transistor T2, and the first electrode 321b and the second electrode 321c of the switching transistor T1, the first electrode 323b, the second electrode 323c and the gate 323a of the driving transistor T3 correspond to the semi-transparent region; and other areas correspond to the transparent region. Before controlling the exposure conditions (energy and duration) to control the etching, the photoresist in the transparent region is relatively thick, the photoresist in the semi-transparent region is relatively thin, and no photoresist remains in the opaque region.

No interlayer dielectric layer ILD is provided on the first transparent electrode plate 311, thereby improving the light transmittance of the opening of the light-emitting structure 20.

Step S17: A first electrode and a second electrode are formed on a side of the interlayer dielectric layer ILD away from the substrate 10, and in the opening and the first through hole.

Figure 9:
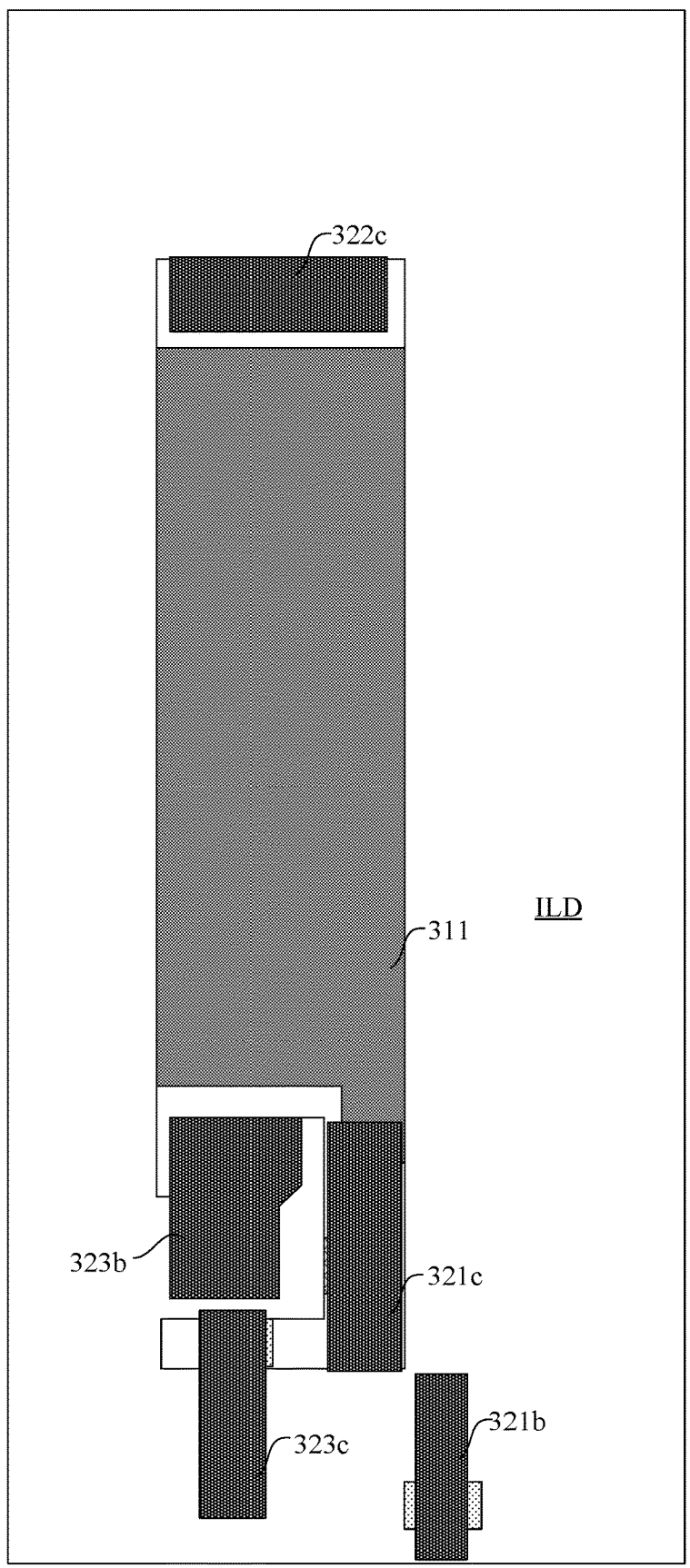
FIG. 9 illustrates a first electrode and a second electrode added to the structure of FIG. 7.
Figure 10:
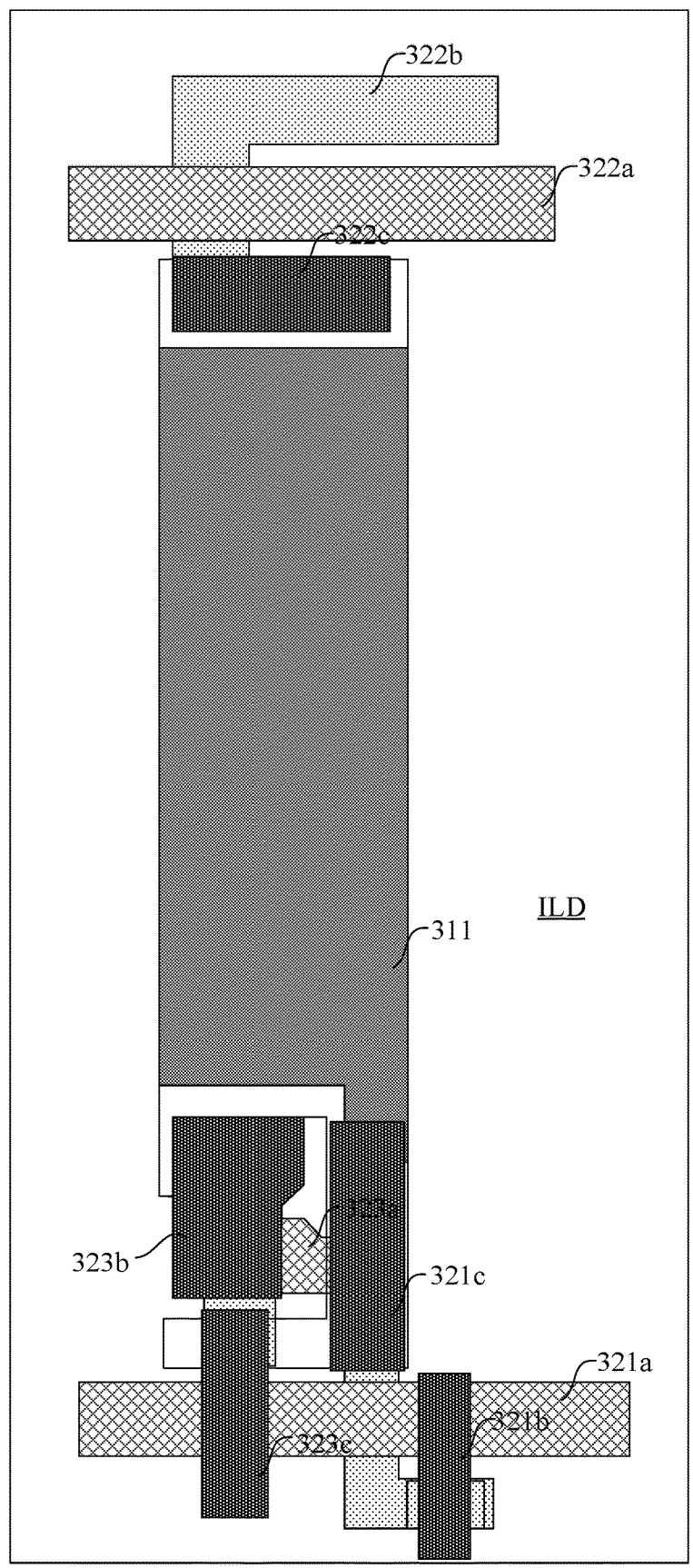
FIG. 10 illustrates an interlayer dielectric layer of FIG. 9 in perspective.

FIG. 9 illustrates a first electrode and a second electrode added to the structure of FIG. 7, and FIG. 10 illustrates the interlayer dielectric layer of FIG. 9 in perspective.

Referring to FIG. 2, FIG. 9, and FIG. 10, the added first electrode and the added second electrode include: the second electrode 322c of the sensing transistor T2, the first electrode 321b and the second electrode 321c of the switching transistor T1, and the first electrode 323b and the second electrode 323c of the driving transistor T3. The second electrode 321c of the switching transistor T1 extends to the gate 323a of the driving transistor T3 (a portion of which is exposed by the opening of the interlayer dielectric layer) and the first transparent electrode plate 311, and laps with the gate 323a of the driving transistor T3 and the first transparent electrode plate 311. The first electrode 323b of the driving transistor T3 extends to an exposed portion of the light-shielding layer SHL and is connected to the light-shielding layer SHL.

The light-shielding layer SHL is electrically connected to the first electrode 323b of the driving transistor T3 to prevent a potential of the light-shielding layer SHL from being floated, which may interfere with a voltage threshold of the driving transistor T3.

It can be seen that the opening provided in the interlayer dielectric layer ILD at least makes that the first electrode, the second electrode, and the gate lap with the first transparent electrode plate 311 directly, thereby achieving a simple processing and a reliable connection.

Referring to FIG. 9, FIG. 10, and FIG. 4, the shape and the position of the first electrode 323b of the driving transistor T3 and the shape and the position of the light-shielding layer SHL may be set to be the same, so that the mask used for forming the light-shielding layer SHL may be used to form the first electrode and the second electrode.

For exposure of positive photoresist, referring to FIG. 5, a shape and a position of the first electrode 323b of the driving transistor T3 correspond to the opaque region of the first translucent mask HTM1; shapes and positions of the second electrode 322c of the sensing transistor T2, the first electrode 321b and the second electrode 321c of the switching transistor T1, and the second electrode 323c of the driving transistor T3 correspond to the semi-transparent region; and other regions correspond to the transparent region. Before forming the second electrode 322c of the sensing transistor T2, the first electrode 321b and the second electrode 321c of the switching transistor T1, and the first electrode 323b and the second electrode 323c of the driving transistor T3 by etching through controlling exposure conditions (energy or duration) or duration of ashing, photoresist remains in the opaque region and the semi-transparent region, and no photoresist remains in the transparent region.

For exposure of negative photoresist, the opaque region and the transparent region of the first half-tone mask HTM 1 are opposite to the opaque region and the transparent region as illustrated in FIG. 5. That is, the semi-transparent region remains unchanged, and the shape and the position of the first electrode 323b of the driving transistor T3 correspond to the transparent region of the first half-tone mask HTM1; the shapes and the positions of the second electrode 322c of the sensing transistor T2, the first electrode 321b and the second electrode 321c of the switching transistor T1, and the second electrode 323c of the driving transistor T3 correspond to the semi-transparent region; and other regions correspond to the opaque region. Before forming form the second electrode 322c of the sensing transistor T2, the first electrode 321b and the second electrode 321c of the switching transistor T1, and the first electrode 323b and the second electrode 323c of the driving transistor T3 by etching through controlling exposure conditions (energy or duration) or duration of ashing, photoresist remains in the transparent region and the semi-transparent region, and no photoresist remains in the opaque region.

Step S18: forming a passivation layer PVX on a side of the interlayer dielectric layer ILD, the first transparent electrode plate 311, the first electrode and the second electrode away from the substrate 10; forming a second through hole in the passivation layer PVX, the second through hole exposing a portion of the second electrode 322c of the sensing transistor T2 and a portion of the first electrode 323b of the driving transistor T3.

Figure 11:
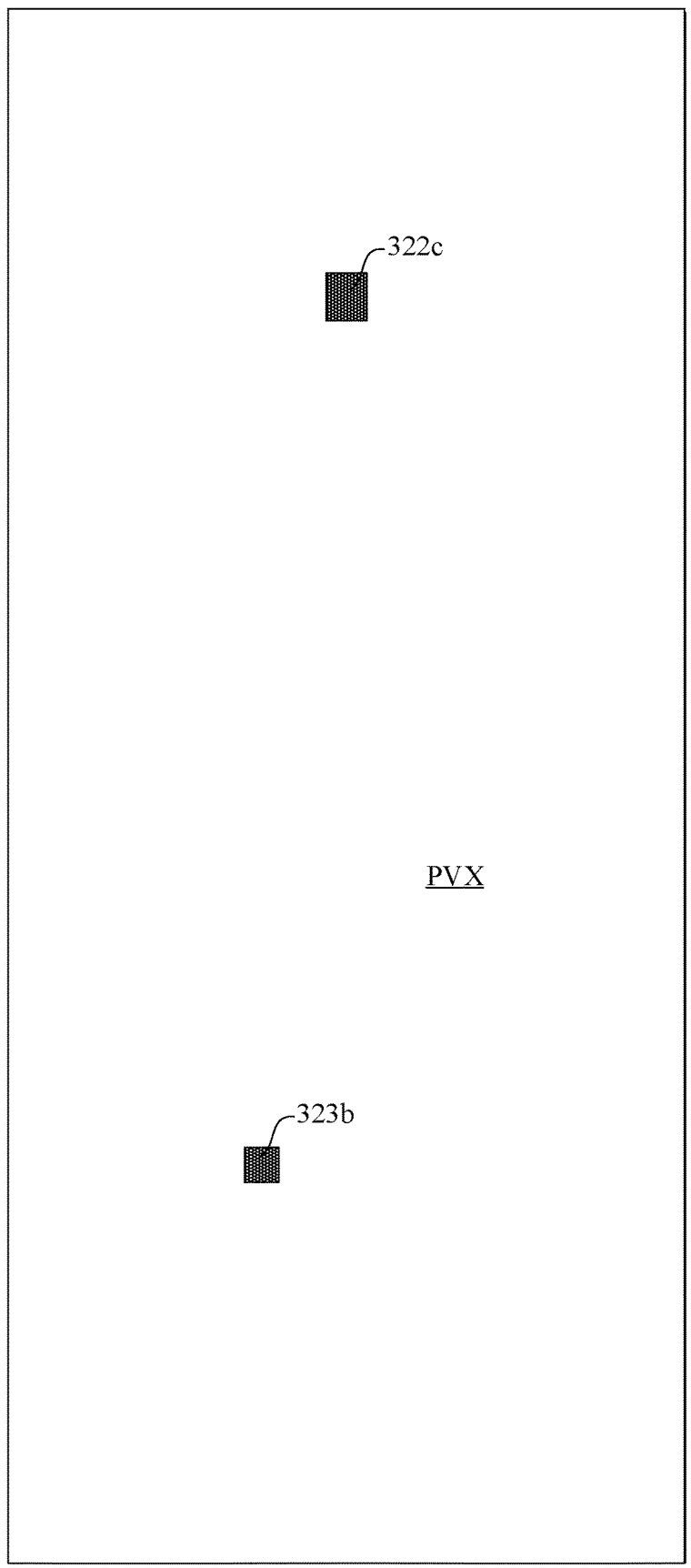
FIG. 11 illustrates a passivation layer added to the structure of FIG. 9.

FIG. 11 illustrates a passivation layer added to the structure of FIG. 9.

Referring to FIG. 11 and FIG. 2, a second through hole is provided in the passivation layer PVX, and the second through hole exposes a portion of the second electrode 322c of the sensing transistor T2 and a portion of the first electrode 323b of the driving transistor T3.

Step S19: a second transparent electrode plate 312 is formed on a side of the passivation layer PVX away from the substrate 10, and a first electrical connection structure 41 and a third electrical connection structure 43 are formed by filing the second through holes.

Figure 12:
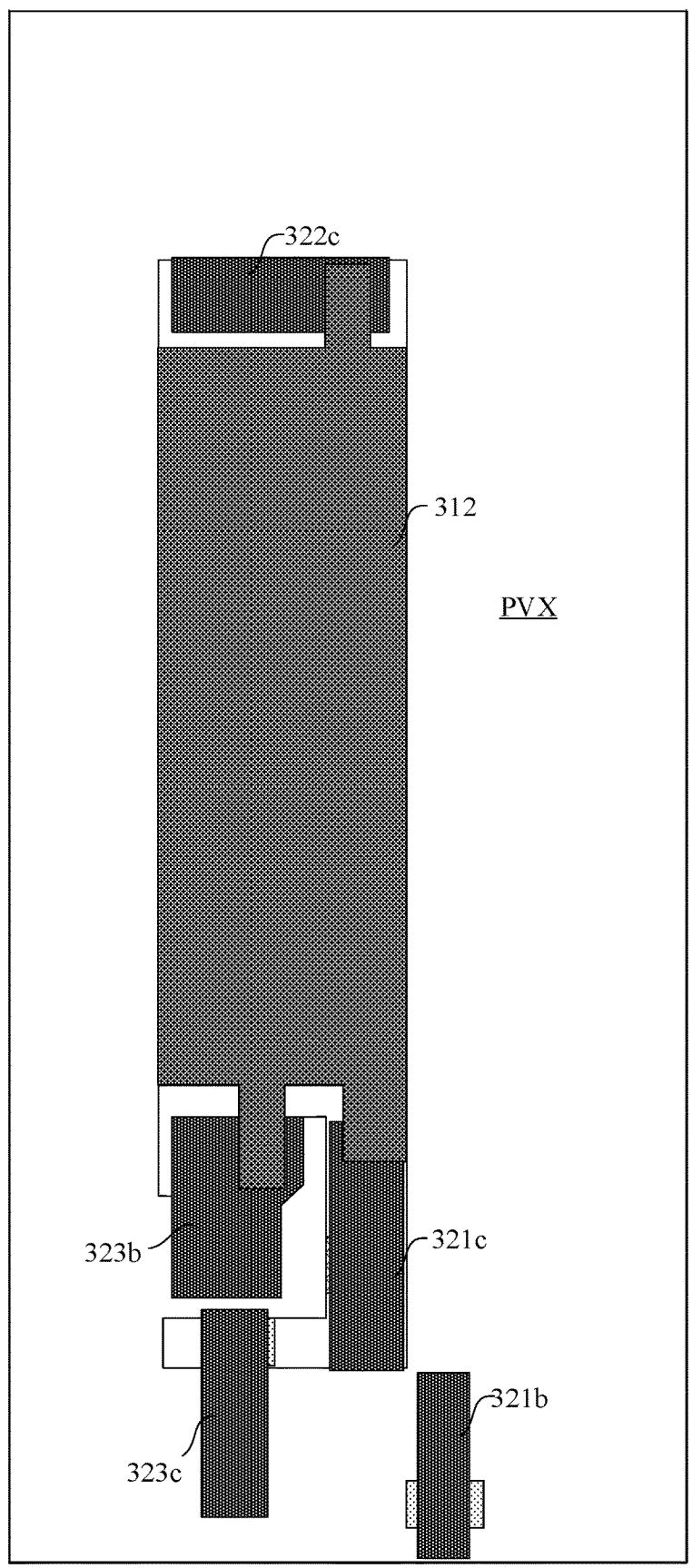
FIG. 12 illustrates a second transparent electrode plate added to the structure of FIG. 11, in which the passivation layer is illustrated in perspective.

FIG. 12 illustrates a second transparent plate added to the structure of FIG. 11, in which the passivation layer is illustrated in perspective.

As illustrated in FIG. 12 and FIG. 2, in a case of forming the second transparent plate 312, a conductive material is also filled in the second through hole in the passivation layer PVX, thereby forming a first electrical connection structure connecting the second transparent electrode plate and the first electrode 323b of the driving transistor T3 and a third electrical connection structure 43 connecting the second transparent electrode plate 312 and the second electrode 322c of the sensing transistor T2.

A shape and a position of a portion of the second transparent electrode plate 312 are the same as a shape and a position of the first transparent electrode plate 311, so that the mask in a case of making the second transparent electrode plate 312 is the same as the second half-tone mask HTM2 for making the first transparent electrode plate 311.

As illustrated in FIG. 6 and FIG. 12, for exposure of positive photoresist, a shape and a position of a portion of the second transparent electrode plate 312 overlapping the first transparent electrode plate 311 correspond to the opaque region, a shape and a position of other portion of the second transparent electrode plate 312 corresponds to the semi-transparent region, and remaining portions correspond to the opaque region. Before forming the second transparent electrode plate 312 by etching through controlling exposure conditions (energy or duration) or duration of ashing, photoresist remains in the opaque region and the semi-transparent region, and no photoresist remains in the transparent region.

For exposure of negative photoresist, the opaque region and the transparent region of the second half-tone mask HTM 2 are opposite to the opaque region and the transparent region as illustrated in FIG. 6. That is, a shape and a position of a portion of the second transparent electrode plate 312 overlapping with the first transparent electrode plate 311 correspond to the transparent region, a shape and a position of other portion of the second transparent electrode plate 312 correspond to the semi-transparent region, and other portions correspond to the opaque region. Before controlling etching the second transparent electrode plate 312 by controlling exposure conditions (energy or duration) or duration of ashing, photoresist remains in the transparent region and the semi-transparent region, and no photoresist remains in the opaque region.

Figure 13:
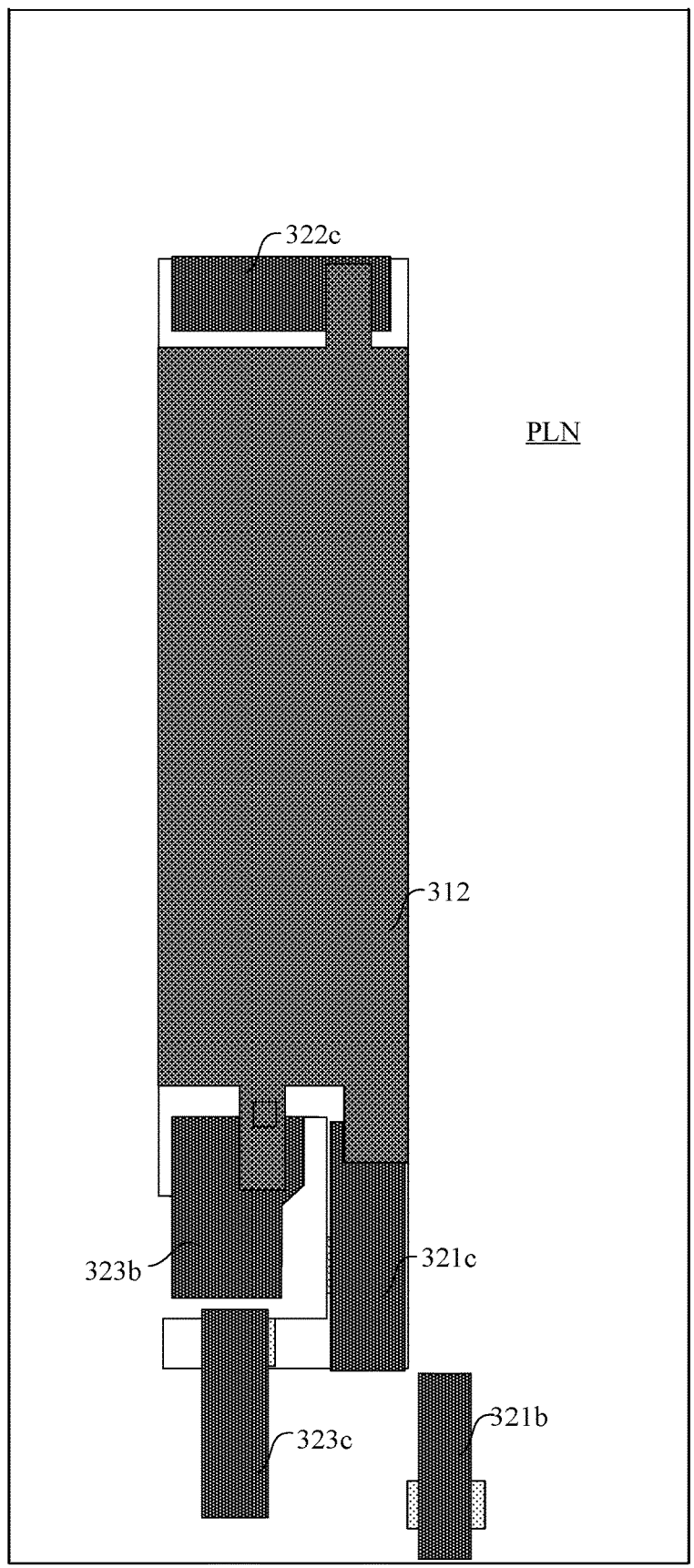
FIG. 13 illustrates a planarization layer added to the structure of FIG. 12, wherein the planarization layer and the passivation layer are illustrated in perspective.

FIG. 13 illustrates a planarization layer added to the structure of FIG. 12, wherein the planarization layer and the passivation layer are illustrated in perspective.

A third through hole is provided in the planarization layer PLN, so as to expose a portion of the second transparent electrode plate 312.

Step S2 includes steps S21 to S22.

Step S21: a planarization layer PLN is formed on a side of the passivation layer PVX and the second transparent electrode plate 312 away from the substrate 10; a third through hole is formed in the planarization layer PLN, the third through hole exposing a portion of the second transparent electrode plate 312.

Step S22: a first electrode 20a is formed on a side of the planarization layer PLN away from the substrate 10; forming a pixel definition layer PDL on the first electrode 20a and a portion of the planarization layer PLN that is not covered by the first electrode 20a; an opening that exposes a portion of the first electrode 20a is formed in the pixel definition layer PDL, and a light-emitting layer 20c is formed in the opening, and a second electrode 20b is formed on the light-emitting layer 20c and the pixel definition layer PDL.

Referring to FIG. 2, a first electrode 20a is disposed on the planarization layer PLN, and a pixel definition layer PDL is disposed on the first electrode 20a and a portion of the planarization layer PLN which is not coated by the first electrode 20a, an opening exposing a portion of the first electrode 20a is provided in the pixel definition layer PDL, a light-emitting layer 20c is disposed in the opening, and a second electrode 20b is disposed on the light-emitting layer 20c and the pixel definition layer PDL. The first electrode 20a, the light-emitting layer 20c, and the second electrode 20b form the light-emitting structure 20. The light-emitting structure may be a red light-emitting structure, a green light-emitting structure, or a blue light-emitting structure, or a red light-emitting structure, a green light-emitting structure, a blue light-emitting structure, or a white light-emitting structure. The light-emitting structures of the three primary colors of red, green and blue or of the four primary colors of red, green, blue and white form a light-emitting structure unit. The light-emitting layer 20c may be an organic light-emitting material layer (OLED). The first electrode 20a may be an anode, specifically a transparent anode made of transparent conductive material such as indium tin oxide (ITO); the second electrode 20b may be a cathode with a light-reflecting function, and the second electrode 20b may be formed from silver. Thus, the light-emitting structure 20 is a bottom emitting structure 20 and emits light towards the substrate 10. The second electrode 20b of each bottom light-emitting structure 20 may be connected to form a surface electrode.

The light-emitting layer 20c may emit red light, green light or blue light of three primary colors by selecting its material. Or, color filters may be disposed on a side of the passivation layer PVX away from the substrate 10 to obtain red light, green light, and blue light of primary three colors.

In a case of forming the first electrode 20a on the planarization layer PLN, a conductive material is filled in the third through hole in the planarization layer PLN so as to form a second electrical connection structure 42 connecting the first electrode 20a and the second transparent electrode plate 312.

The shape and the position of the first electrode 20a may be the same as the shape and the position of the second transparent electrode plate 312, so that a mask for forming the first electrode 20a may be same as the mask for forming the first transparent electrode plate 311 or the second transparent electrode plate 312, that is, the second half-tone mask HTM2, as illustrated in FIG. 6.

In some embodiments of the present disclosure, the pixel driving circuit may further have a structure such as 2T1C, 7T1C, and so on.

In some embodiments of the present disclosure, the gate of the transistor may be a bottom gate, that is, the gate is disposed adjacent to the substrate 10 and the active layer is disposed away from the substrate 10 with respect to the gate.

According to the above-mentioned embodiments, the first transparent electrode plate 311 and the second transparent electrode plate 312 enable an orthographic projection of the storage capacitor Cst on the substrate 10 to partially overlap with an orthographic projection of the light-emitting structure 20 on the substrate 10, and an orthographic projection of the first transparent electrode plate 311 on the substrate 10 is located within an orthographic projection of the second transparent electrode plate on the substrate 10. Compared with a solution in which two electrodes of the storage capacitor Cst are opaque electrodes, the aperture ratio and a pixel density (PPI) may be increased in the embodiments of the present disclosure.

Figure 14:
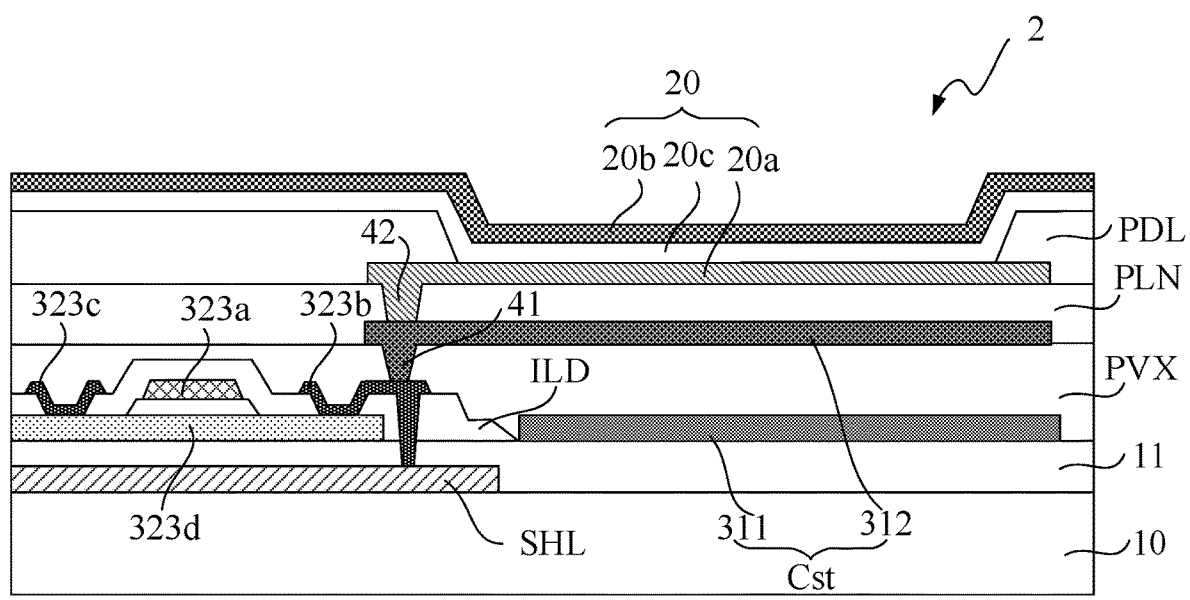
FIG. 14 illustrates a schematic structural view of a cross-section of a display panel according to another embodiment of the present disclosure.

FIG. 14 illustrates a schematic diagram of a cross-sectional structure of a display panel according to another embodiment of the present disclosure. Referring to FIG. 14, a display panel 2 according to the embodiment is substantially the same as the display panel 1 as illustrated in FIGS. 1 to 4, 7, and 9 to 13, except that an orthographic projection of the first electrical connection structure 41 on the substrate 10 coincide with an orthographic projection of the second electrical connection structure 42 on the substrate 10.

Compared with FIG. 1 and FIG. 2, in which the first electrical connection structure 41 is disposed far away from the first transparent electrode plate 311 and the second transparent electrode plate 312 with respect to the second electrical connection structure 42, area of the opaque region is reduced, area of the transparent region is increased and the pixel density are increased in the solution of FIG. 14.

Figure 15:
FIG. 15 illustrates a top view of a fourth half-tone mask.

FIG. 15 illustrates a top view of the fourth half-tone mask.

Correspondingly, for the manufacturing method of the display panel 2, the shape and the position of the third through hole in the planarization layer PLN in step S21 are the same as the shape and position of a second through hole in the passivation layer PVX in step S18, so that The mask for forming the planarization layer PLN and the mask for forming the passivation layer PVX may be a same half-tone mask, that is, the fourth half-tone mask HTM 4.

Referring to FIG. 15, the fourth half-tone mask HTM 4 has an opaque region, a semi-transparent region, and a transparent region.

For exposure of positive photoresist, the shape and the position of the third through hole in the planarization layer PLN and the shape and the position of the second through hole in the passivation layer PVX that exposes the first electrode 323b of the driving transistor T3 correspond to the transparent region, the through hole in the passivation layer PVX that exposes the second electrode 322c of the sensing transistor T2 corresponds to the semi-transparent region, and other areas correspond to the opaque region. Before forming the planarization layer PLN by etching through controlling exposure conditions (such as energy or duration) or ashing duration, photoresist remains in the opaque region and the semi-transparent region, and no photoresist remains in the transparent region; and photoresist only remains in the opaque region before forming the passivation layer PVX.

For exposure of negative photoresist, the opaque region and the transparent region of the fourth half-tone mask HTM 4 are opposite to the opaque region and the transparent region as illustrated in FIG. 15. That is, the semi-transparent region remains unchanged, and the shape and the position of the third through hole in the planarization layer PLN and the shape and the position of the second through hole in the passivation layer PVX that exposes the first electrode 323b of the driving transistor T3 correspond to the opaque region; the through hole in the passivation layer PVX that exposes the second electrode 322c of the sensing transistor T2 corresponds to the semi-transparent region; other regions correspond to the transparent region. Before forming the planarization layer PLN by etching through controlling exposure conditions (energy or duration) or ashing duration, photoresist remains in the transparent region and the semi-transparent region, and no photoresist remains in the opaque region. And photoresist only remains in the transparent region before forming the passivation layer PVX by etching.

Figure 16:
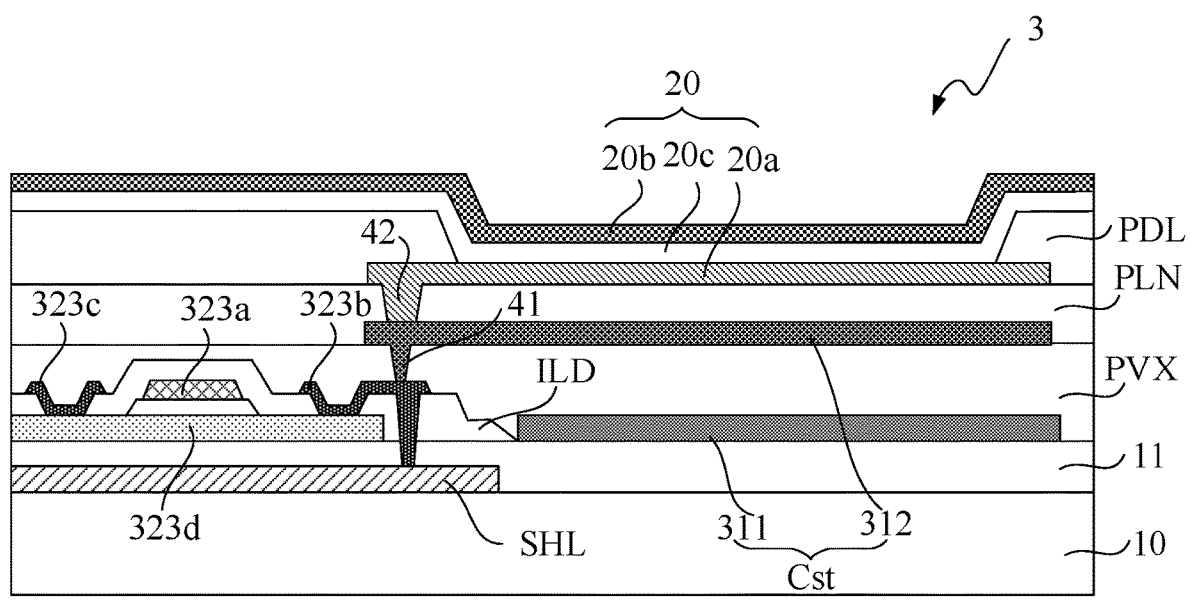
FIG. 16 illustrates a schematic structural view of a cross-section of a display panel according to another embodiment of the present disclosure.

FIG. 16 illustrates a schematic structural view of cross section of a display panel according to another embodiment of the present disclosure. Referring to FIG. 16, the display panel 3 according to this embodiment is substantially the same as the display panel 2 as illustrated in FIG. 14, except that an orthographic projection of the first electrical connection structure 41 on the substrate 10 is located within an orthographic projection of the second electrical connection structure 42 on the substrate 10.

With respect to the solution as illustrated in FIG. 14, a size of the first electrode 323b of the driving transistor T3 as illustrated may be disposed smaller, thereby reducing area of the opaque region, increasing area of the transparent region and increasing the pixel density.

In some embodiments of the present disclosure, in a case that an orthographic projection of the first electrical connection structure 41 on the substrate 10 and an orthographic projection of the second electrical connection structure 42 on the substrate 10 are not aligned, a size of the orthographic projection of the first electrical connection structure 41 on the substrate 10 may be smaller than a size of the orthographic projection of the second electrical connection structure 42 on the substrate 10. A size of the first electrode 323b of the driving transistor T3 can be made small in this solution, thereby reducing area of an opaque region.

Based on the display panels 1, 2, and 3 as described above, an embodiment of the present disclosure further provides a display device, including any one of the display panels 1, 2, 3.

The display device can be any product or component with display function such as electronic paper, mobile phone, tablet computer, television, laptop computer, digital photo frame, navigator, and etc.

It should be noted that the sizes of layers and regions may be exaggerated in the drawings for clarity of illustration. It should be further understood that in a case that an element or layer is referred to as being "on" another element or layer, it can be directly on the other element or layer or intervening elements or layers may be present. Furthermore, it should be understood that in a case that an element or layer is referred to as being "under" another element or layer, it can be directly under the other element or layer, or there may be at least one intervening element or layer. Furthermore, it should be understood that in a case that an element or layer is referred to as being "between" two layers or elements, it can be the only layer between the two layers or two elements, or more than one intervening layer or element may also be present. Similar reference signs indicate similar elements throughout.

In the present disclosure, the terms "first" and "second" are only used for descriptive purposes, and cannot be understood as indicating or implying relative importance.

After considering the specification and practicing the disclosure disclosed herein, one of ordinary skill in the art will easily think of other embodiments of the present disclosure. The present disclosure is intended to cover any variants, applications, or modifications of the present disclosure. These variants, applications, or modifications follow the general principles of this disclosure and include common knowledge or commonly used technical means in the art that are not disclosed in this disclosure. The description and embodiments are only regarded as exemplary, and the true scope and spirit of the disclosure are set forth by the appended claims.

It should be understood that the present disclosure is not limited to the exact structure that has been described above and illustrated in the drawings, and modifications or variants can be made without departing from its protection scope. The protection scope of the present disclosure is only defined by the appended claims.

The invention claimed is:

1. A display panel, comprising:
   a substrate;
   a light-emitting structure disposed on the substrate; and
   a pixel driving circuit disposed between the substrate and the light-emitting structure, the pixel driving circuit comprising a storage capacitor, an orthographic projection of the storage capacitor on the substrate at least partially overlapping with an orthographic projection of the light-emitting structure on the substrate;
   wherein the storage capacitor comprises a first transparent electrode plate and a second transparent electrode plate, the first transparent electrode plate is disposed adjacent to the substrate and the second transparent electrode plate is disposed away from the substrate, and an orthographic projection of the first transparent electrode plate on the substrate is located within an orthographic projection of the second transparent electrode plate on the substrate;
   wherein the display panel further comprises a light-shielding layer; the pixel driving circuit comprises a first electrode, a second electrode, and an active region; the first electrode and the second electrode are electrically connected to the active region, and the first electrode is further electrically connected to the second transparent electrode plate; the light-shielding layer is disposed on a side of the active region adjacent to the substrate and is electrically connected to the first electrode;
   wherein an orthographic projection of the first electrode on the substrate completely overlaps with an orthographic projection of the light-shielding layer on the substrate, such that a position and an area of the orthographic projection of the first electrode on the substrate are same as a position and an area of the orthographic projection of the light-shielding layer on the substrate respectively.

2. The display panel according to claim 1, wherein the pixel driving circuit further comprises a transistor, the transistor comprises an active layer and a gate, an interlayer dielectric layer is coated on a side of the active layer and the gate away from the substrate, and the interlayer dielectric layer is provided with an opening at least exposing the first transparent electrode plate.

3. The display panel according to claim 2, wherein the active layer is disposed adjacent to the substrate, the gate is disposed far away from the substrate, and the active layer and the first transparent electrode plate are disposed on a same layer.

4. The display panel according to claim 3, wherein the light-shielding layer is disposed between the substrate and the active layer, and the light-shielding layer is electrically connected to a first electrode or a second electrode of the transistor, and the first electrode of the transistor indicates one of a source and a drain, and the second electrode of the transistor indicates the other of the source and the drain.

5. The display panel according to claim 2, wherein:
   a passivation layer is coated on a side of the interlayer dielectric layer and the first transparent electrode plate away from the substrate, the second transparent electrode plate is disposed on a side of the passivation layer away from the substrate, a planarization layer is disposed on a side of the second transparent electrode plate and the passivation layer away from the substrate, a first electrode of the light-emitting structure is disposed on a side of the planarization layer away from the substrate, a first electrical connection structure is disposed in the passivation layer, the second transparent electrode plate is electrically connected to a first electrode or a second electrode of the transistor via the first electrical connection structure, the first electrode of the transistor indicates one of a source and a drain, and the second electrode of the transistor indicates the other of the source and the drain; and
   a second electrical connection structure is disposed in the planarization layer, the first electrode of the light-emitting structure is electrically connected to the second transparent electrode plate via the second electrical connection structure, and a size of an orthographic projection of the first electrical connection structure on the substrate is less than or equal to a size of an orthographic projection of the second electrical connection structure on the substrate.

6. The display panel according to claim 5, wherein the orthographic projection of the first electrical connection structure on the substrate is located within the orthographic projection of the second electrical connection structure on the substrate.

7. The display panel according to claim 1, wherein the pixel driving circuit has a 3T1C structure, and the 3T1C structure comprises a switching transistor, a driving transistor, and a sensing transistor.

8. The display panel according to claim 1, wherein the light-emitting structure comprises a first electrode, a second electrode, and a light-emitting layer disposed between the first electrode of the light-emitting structure and the second electrode of the light-emitting structure, and the light-emitting layer is an organic light-emitting layer.

9. The display panel according to claim 8, wherein a color filter layer is disposed between the light-emitting structure and the pixel driving circuit.

10. A display device comprising: the display panel according to claim 1.

11. A method of manufacturing a display panel, comprising:
forming a pixel driving circuit on a substrate, the pixel driving circuit comprising a storage capacitor comprising a first transparent electrode plate disposed adjacent to the substrate and a second transparent electrode plate disposed away from the substrate, an orthographic projection of the first transparent electrode plate on the substrate located within an orthographic projection of the second transparent electrode plate on the substrate, wherein the first transparent electrode plate and the second transparent electrode plate are formed with a first half-tone mask; and
forming a planarization layer on a side of the pixel driving circuit away from the substrate, and forming a light-emitting structure on a side of the planarization layer away from the substrate, wherein an orthographic projection of the light-emitting structure on the substrate at least partially overlaps with an orthographic projection of the storage capacitor on the substrate;
wherein the display panel further comprises a light-shielding layer; the pixel driving circuit comprises a first electrode, a second electrode, and an active region; the first electrode and the second electrode are electrically connected to the active region, and the first electrode is further electrically connected to the second transparent electrode plate; the light-shielding layer is disposed on a side of the active region adjacent to the substrate and is electrically connected to the first electrode;
wherein an orthographic projection of the first electrode on the substrate completely overlaps with an orthographic projection of the light-shielding layer on the substrate, such that a position and an area of the orthographic projection of the first electrode on the substrate are same as a position and an area of the orthographic projection of the light-shielding layer on the substrate respectively.

12. The method according to claim 11, wherein the light-emitting structure comprises a first electrode, a light-emitting layer, and a second electrode that are sequentially formed; the first electrode of the light-emitting structure is formed through the first half-tone mask.

13. The method according to claim 11, wherein the pixel driving circuit further comprises a transistor, the transistor comprises an active layer and a gate, and an interlayer dielectric layer is formed on a side of the active layer and the gate away from the substrate, an opening at least exposing the first transparent electrode plate is formed in the interlayer dielectric layer; and
the light-shielding layer and a buffer layer are sequentially formed between the substrate and the active layer, a first through hole is formed in the interlayer dielectric layer and the buffer layer, and the first through hole exposes a portion of the light-shielding layer; and the opening and the first through hole are formed through a second half-tone mask.

14. The method according to claim 13, wherein the transistor comprises a first electrode and a second electrode, the first electrode of the transistor indicates one of a source and a drain, and the second electrode of the transistor indicates the other of the source and the drain; the first electrode of the transistor, the second electrode of the transistor, and the light-shielding layer are formed through the second half-tone mask.

15. The method according to claim 14, wherein:
a passivation layer is formed on a side of the first electrode and the second electrode of the transistor, the interlayer dielectric layer, and the first transparent electrode plate away from the substrate, and a second through hole is formed in the passivation layer, the second through hole exposes the first electrode of the transistor or the second electrode of the transistor; the second transparent electrode plate is formed on a side of the passivation layer away from the substrate, the second transparent electrode plate is electrically connected to the first electrode of the transistor or the second electrode of the transistor through a conductive material in the second through hole; and
the planarization layer is formed on a side of the second transparent electrode plate and the passivation layer away from the substrate, and a third through hole is formed in the planarization layer to expose the second transparent electrode plate, a first electrode of the light-emitting structure is formed on a side of the planarization layer away from the substrate, the first electrode of the light-emitting structure is electrically connected to the second transparent electrode plate via a conductive material in the third through hole, and the third through hole and the second through hole is formed through a third half-tone mask.

* * * * *